(12) United States Patent
Shamiryan et al.

(10) Patent No.: US 7,521,369 B2
(45) Date of Patent: Apr. 21, 2009

(54) SELECTIVE REMOVAL OF RARE EARTH BASED HIGH-K MATERIALS IN A SEMICONDUCTOR DEVICE

(75) Inventors: Denis Shamiryan, Leuven (BE); Marc Demand, Saint-Jean-Geest (BE); Vasile Paraschiv, Kessel-lo (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 0 days.

(21) Appl. No.: 11/876,614

(22) Filed: Oct. 22, 2007

(65) Prior Publication Data

US 2008/0096374 A1    Apr. 24, 2008

Related U.S. Application Data

(60) Provisional application No. 60/945,864, filed on Jun. 22, 2007, provisional application No. 60/853,895, filed on Oct. 23, 2006.

(51) Int. Cl.
*H01L 21/302* (2006.01)

(52) U.S. Cl. .................................. 438/710; 438/717

(58) Field of Classification Search ................ 438/199, 438/704–717, 745–750
See application file for complete search history.

(56) References Cited

U.S. PATENT DOCUMENTS

| 6,764,898 B1 * | 7/2004 | En et al. ...................... 438/240 |
| 2008/0014689 A1 * | 1/2008 | Cleavelin et al. ............ 438/197 |
| 2008/0038900 A1 * | 2/2008 | Thakur et al. ................ 438/455 |

* cited by examiner

*Primary Examiner*—Calvin Lee
(74) *Attorney, Agent, or Firm*—Knobbe Martens Olson & Bear LLP

(57) ABSTRACT

A method is disclosed for the selective removal of rare earth based high-k materials such as rare earth scandate high-k materials (e.g. $DyScO_3$) over silicon or silicon dioxide. As an example Dy and Sc comprising high-k materials are used as a high-k material in gate stacks of a semiconductor device. The selective removal and etch of this high-k material is very difficult since Dy and Sc (and their oxides) are difficult to etch. The etching could however be easily stopped on them. For patterning of the metal gates comprising TiN and TaN on top of rare earth based high-k layer a chlorine-containing gases ($Cl_2$ and $BCl_3$) can be used since titanium ant tantalum chlorides are volatile and reasonable selectivity to other material present on the wafer (Si, $SiO_2$) can be obtained. The Dy and Sc chlorides are not volatile, but they are water soluble. This behavior makes it possible that the surface layer of Dy and Sc comprising high-k materials gets chlorinated (brominated) during exposure to the Cl or Br comprising plasma and can be removed after etch by a water rinse.

21 Claims, 5 Drawing Sheets

SELECTIVE REMOVAL OF RARE EARTH BASED HIGH-K MATERIALS IN A SEMICONDUCTOR DEVICE

CROSS-REFERENCE TO RELATED APPLICATIONS

This application claims the benefit under 35 U.S.C. § 119(e) of U.S. provisional application Ser. No. 60/945,864, filed Jun. 22, 2007, and U.S. provisional application Ser. No. 60/853,895, filed Oct. 23, 2006, the disclosures of which are hereby expressly incorporated by reference in their entirety and are hereby expressly made a portion of this application.

FIELD OF THE INVENTION

The preferred embodiments are related to the field of semiconductor processing. More specifically it is related to the selective removal of rare earth based high-k layers, more specifically to a rare earth scandate or rare earth oxide high-k material (e.g. $DyScO_3$ and/or $Dy_2O_3$). The preferred embodiments are further related to a method to make Dy and/or Sc comprising high-k materials (e.g. $DyScO_3$ and/or $Dy_2O_3$) soluble or in other words makes it possible to remove the materials by using a wet etching.

BACKGROUND OF THE INVENTION

The semiconductor industry is facing the challenging task of finding a candidate to replace silicon oxide, which has been the CMOS gate dielectric of choice for more than 50 years. A material with a dielectric constant (k) higher than $SiO_2$ will allow making the dielectric thicker by a factor of $k/k(SiO_2)$, hence lowering the gate current leakage levels, and this without reduction of the capacitance and thus performance. The k-value is, however, only one of a list of requirements that includes thermal and chemical stability, a wide bandgap, limited interfacial layer formation, a controllable etch behavior, correct and stable threshold voltage, and a good reliability (i.e. over a 10-year life time).

At present, the semiconductor industry's focus is on $HfO_2$ and $HfSiO_x$, but parallel to the main stream development of $HfO_2$ and $HfSiO_x$, material screening of alternate dielectrics continues. The interest in these alternative materials arises from the fact that several issues remain with the Hf-based dielectrics. Among the issues are, targeting the correct threshold voltage, the limited improvement in k-value for $HfSiO_x$, and the necessity of nitridation to stabilize the material and prevent phase separation.

One class of materials being investigated and reported on are the rare earth based high-k materials such as rare earth scandate materials ($REScO_3$). First results obtained by Pulsed Laser and E-Beam Deposition suggest that these materials have a k-value comparable to $HfO_2$ in combination with a high thermal stability.

Following deposition and gate patterning, the high-k dielectric material must be removed from the source and drain regions of the transistor. This removal must be accomplished without the loss of any of the underlying silicon, as well as little or no isolation oxide (field oxide) loss. In U.S. Pat. No. 6,656,852 a method is disclosed for etching a high-k dielectric. The method involves removing an exposed portion of a high-k dielectric layer from a substrate by wet etching with a solution comprising water, a strong acid, an oxidizing agent, and a fluorine compound. The etching solution provides selectivity towards the high-k film against insulating materials and poly-silicon however this method is not applicable to the rare earth scandate materials (REScOx) since these oxides are etched too fast and due to isotropic nature of wet etching an unacceptable undercut is formed under the gate.

The problem is removal of the rare earth based high-k dielectric selectively over the Si substrate and without making an undercut under the gate. Dry removal is impossible for these rare earth compounds since these compounds (e.g. Dy and Sc) form no volatile compounds. A wet removal is possible, but due to isotropic nature of wet etch it etches the high-k dielectric (e.g. $DyScO_3$) dielectric also laterally, creating an undercut at the gate edge beneath the gate.

SUMMARY OF THE INVENTION

A method for removing high-k materials containing rare earth metal oxides selectively over a substrate or layer underneath is provided. The layer or substrate underneath may be a silicon and silicon dioxide materials.

A method for patterning a gate structure comprising a gate electrode and a gate oxide layer using a combination of a dry etch plasma and a wet removal step thereby avoiding undercut and lateral attack of the patterned gate structure is provided.

According to preferred embodiments a method for the removal of at least part of a layer selectively over a substrate underneath the layer wherein the layer is made of a compound or a combination of compounds which are not etchable using conventional dry etching techniques or not selectively etchable using conventional wet etching techniques is disclosed. To perform the method, the compound must be able to form water soluble chlorides or bromides or in other words to achieve a novel chlorine and/or bromide containing compound which is water soluble.

According to preferred embodiments is achieved by first subjecting the substrate comprising the layer to be removed to a chlorine or bromine comprising plasma such that "novel" chlorine and/or bromide containing compounds are formed and second removing the novel chlorine and/or bromide containing compound using a water based rinse. The water based rinse can refer to pure water or water with additives to achieve better removal.

According to preferred embodiments a method for the patterning of a high-k comprising stack is disclosed. More specifically it relates to the dry etching of high-k layers comprising rare earth metal oxides.

According to preferred embodiments a method is disclosed for patterning a high-k gate insulating structure in a semiconductor device. This method comprises at least the steps of first providing a substrate and depositing a high-k layer onto the substrate. Subsequently a mask structure is developed to define a gate structure on the high-k layer and to expose parts of the high-k layer. The exposed parts of the high-k layer are then subjected to a Cl and/or Br comprising plasma (not containing a F compound) to chlorinate or to brominate at least part of the exposed high-k layer. Finally the chlorinated (brominated) part of the high-k layer is removed using a wet etch. The wet etch is preferably a water based wet etch which can contain further additives to enhance the solubility.

According to preferred embodiments the method further comprises before the step of developing a mask structure the steps of depositing a gate electrode layer onto the high-k layer, depositing photosensitive imaging layers and transferring a photolithographic pattern in the imaging layers to define the gate structure and transferring the gate structure pattern into the gate electrode layer.

According to preferred embodiments the method further comprises before the step of developing a mask structure onto the rare earth comprising high-k layer the steps of depositing a second high-k layer to create a dual high-k layer (or dual dielectric) and a gate electrode layer. The method then further comprises the steps of depositing photosensitive imaging layers and transferring a photolithographic pattern in the imaging layers to define the gate structure and transferring the gate structure pattern into the gate electrode layer underneath.

In case of dual dielectric layer or in other words two high-k layers care needs to be taken that at the interface of the two high-k layers no complex compounds are formed comprising the rare earth compounds which are not soluble anymore after chlorination or bromination. For example at the interface of a Hf comprising high-k layer and a Dy comprising high-k layer (e.g. DyScO) DyHf comprising compounds will be formed which are not soluble anymore after chlorination (bromination).

Preferably the step of subjecting the exposed parts of the high-k layer is performed by an anisotropic dry-etch plasma.

Preferably the step of subjecting the exposed parts of the high-k layer is performed by an anisotropic dry-etch plasma during the step of patterning the gate electrode layer using a Cl and/or Br comprising plasma whereby during the etching the exposed portions of the high-k layer gets chlorinated (brominated).

Preferably the high-k material is a high-k material comprising rare earth elements.

More preferred the high-k material is a rare earth oxide selected from at least one of $Dy_2O_3$, $La_2O_3$, $Pr_2O_3$, $Nd_2O_3$, $Gd_2O_3$, $Tb_2O_3$, $Ho_2O_3$, $Er_2O_3$, $Tm_2O_3$, $Yb_2O_3$, $Lu_2O_3$.

Most preferred the high-k material is a rare earth scandate material selected from at least one of $DyScO_3$, $LaScO_3$, $PrScO_3$, $NdScO_3$, $GdScO_3$, $TbScO_3$, $HoScO_3$, $ErScO_3$, $TmScO_3$, $YbScO_3$ and $LuScO_3$.

A preferred example of the high-k material is $DyScO_3$.

Preferably the Cl comprising plasma is a $Cl_2$ or $BCl_3$ comprising plasma.

Preferably the Br comprising plasma is a $Br_2$ or HBr comprising plasma.

Preferable the substrate is a silicon wafer.

In an alternative embodiment and also preferred an interlayer is deposited onto the substrate before depositing the high-k layer.

Preferably the gate electrode layer is a TaN, TiN, TaN/TiN layer.

Most preferred the wet etch is a water rinse.

Preferably the substrate bias during the step of subjecting the exposed parts of the high-k layer to a Cl comprising and/or Br comprising plasma is −30V.

Preferably the plasma power during the step of subjecting the exposed parts of the high-k layer to a Cl comprising and/or Br comprising plasma is in the range of 100 W up to 1200 W.

More preferred the plasma power during the step of subjecting the exposed parts of the high-k layer to a Cl comprising and/or Br comprising plasma is around 450 W.

Preferably the pressure in the plasma during the step of subjecting the exposed parts of the high-k layer to a Cl comprising and/or Br comprising plasma is minimum 10 mT (1.333 Pa) and maximum 80 mT (10.665 Pa).

More preferred the pressure in the plasma during the step of subjecting the exposed parts of the high-k layer to a Cl comprising and/or Br comprising plasma is 10 mT (1.333 Pa).

BRIEF DESCRIPTION OF THE DRAWINGS

All drawings are intended to illustrate some aspects according to preferred embodiments. Not all alternatives and options are shown and therefore not limited to the content of the given drawings.

DETAILED DESCRIPTION OF THE PREFERRED EMBODIMENT

Figure 1:
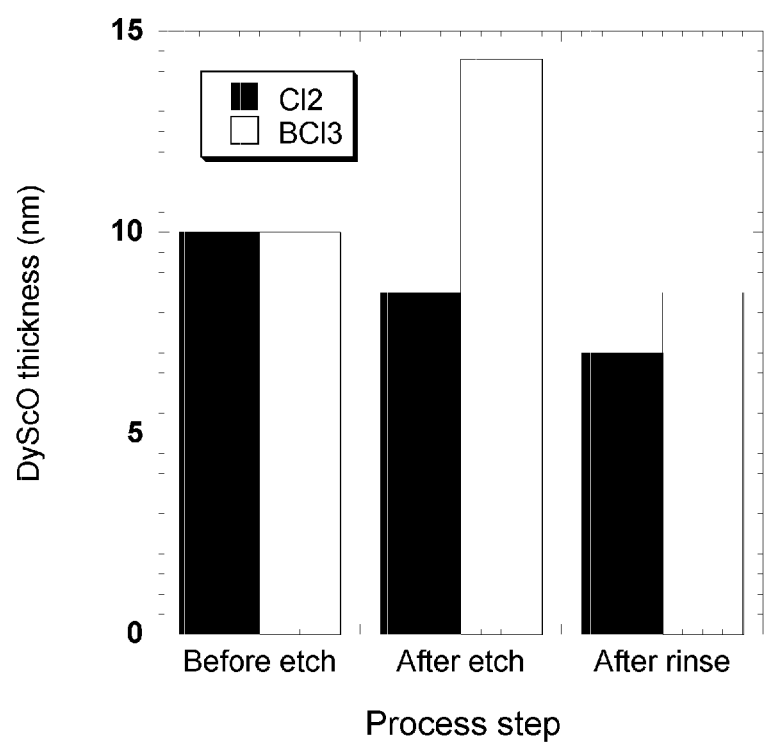
FIG. 1 illustrates $DyScO_3$ thickness after the removal experiments according to preferred embodiments. The initial thickness is 10 nm, after exposure to $Cl_2$ plasma for 30 s about 1.5 nm is removed, probably due to physical sputtering. The $BCl_3$ plasma deposits as film on top (probably BxCly film), but does not result in the thickness decrease. Water rinse removes around 1.5 nm in the case of $DyScO_3$ exposure to $Cl_2$ (probably, the chlorinated layer) and around 5.5 nm in the case of $BCl_3$ exposure (BxCly film plus chlorinated $DyScO_3$). The thickness of $DyScO_3$ in real devices usually in the range of 2-4 nm.

In relation to the drawings the preferred embodiments are described very briefly and general in the sequel. It is apparent, however, that a person skilled in the art knows how to perform the etch process in detail and compose an etch recipe.

According to preferred embodiments, the term substrate bias refers to the voltage applied to the substrate in a Reactive Ion Etching (RIE) chamber. This value is expressed in Volt (as a negative number). The absence of substrate bias (Bias=0) gives substantially no ion bombardment meaning almost no etching behavior. To achieve a vertical treatment (or exposure) of the substrate by the plasma, a substrate bias is preferred to avoid lateral etch of the structures due to exposure to plasma components.

According to preferred embodiments, the term "anisotropic etch" refers to the etching process in which etch rate in the direction perpendicular to the surface (or substrate) is much higher than in direction parallel to the surface (or substrate). This in contrast to "isotropic etch" in which the etching occurs the same in any direction or being non-directional.

According to preferred embodiments, the term "high-k material" refers to a dielectric material with a dielectric constant greater than the dielectric constant of silicon dioxide, k>4. As minimum feature sizes have shrunk it has been necessary to shrink the thickness of the gate oxides in proportion. Examples of the high-k materials in the preferred embodiments are Rare-earth based high-k materials such as Dy and Sc comprising high-k materials.

According to preferred embodiments, the term Rare-earth based high-k materials refers to high-k materials comprising rare earth elements such as rare earth scandates and rare earth oxides. Rare earth scandates refers to following structure $ReScO_3$ wherein Re=La, Pr, Nd, Sm, Gd, Tb, Dy, Ho, Er, Tm, Yb or Lu, i.e., the entire series for which the individual oxides are chemically stable in contact with Si. Examples of Rare-earth scandates in the preferred embodiments are $DyScO_3$, $LaScO_3$, $PrScO_3$, $NdScO_3$, $GdScO_3$, $TbScO_3$, $HoScO_3$, $ErScO_3$, $TmScO_3$, $YbScO_3$ and $LuScO_3$. Rare earth oxides correspond to the following structure $Re_2O_3$ wherein Re=La, Pr, Nd, Sm, Gd, Tb, Dy, Ho, Er, Tm, Yb, or Lu. Examples of rare earth oxides are $La_2O_3$, $Pr_2O_3$, $Nd_2O_3$, $Sm_2O_3$, $Gd_2O_3$, $Dy_2O_3$, $Y_2O_3$, $Er_2O_3$, and $Yb_2O_3$.

According to preferred embodiments "integrated circuit" includes devices formed on semiconducting substrates, such as group IV materials like silicon or germanium, or group III-V compounds like gallium arsenide, or structured substrate such as silicon-on-insulator, strained silicon and silicon-germanium, or mixtures of such materials. The term includes all types of devices formed, such as memory and logic, and all designs of such devices, such as MOS and bipolar. The term also comprehends applications such as flat panel displays, solar cells, and charge coupled devices.

According to preferred embodiments the problem of patterning rare earth based high-k materials such as Dy and Sc based high-k materials using reactive ion dry-etching techniques is solved. More specifically the problem is the removal of the rare earth based high-k materials selectively over a substrate such as a Si comprising substrate without making an undercut under the gate. The dry-etching of the rare earth based high-k materials (e.g. Dy and Sc) is hardly possible at close to room temperatures due to very low volatility of e.g. dysprosium and scandium. For example the volatility of dysprosium and scandium halides after etching in a halogen plasma is too low such that these compounds can not be removed in a dry etch chamber using state of the art techniques. The overview of the melting points (boiling points are not available) for dysprosium and scandium halides is presented in Table I. It is clear that making a volatile product at 60° C. (wafer temperature during plasma etch in reactor) is impossible.

TABLE 1

Melting points of Dysprosium and Scandium halides.

| Compound (M = Dy or Sc) | Melting point, ° C. Dy | Sc |
| --- | --- | --- |
| $MF_3$ | 1154 | 1515 |
| $MCl_3$ | 680 | 967 |
| $MBr_3$ | 879 | 969 |

It is therefore an object to provide a method for patterning layer containing rare earth based high-k materials such as Dy and Sc comprising high-k materials. More specifically a method is disclosed to allow selective removal of rare earth based high-k materials such as Dy and Sc comprising high-k materials selectively over a layer underneath. As an example the layer underneath can be a Si comprising layers such as polycrystalline Si (poly-Si) and Silicon-dioxide ($SiO_2$) comprising layer.

It is further an aim to provide a method which is using semiconductor compatible process technology steps.

According to preferred embodiments, a method is disclosed for selectively removing, at least partly, a rare earth comprising layer over a substrate. The method comprising at least the steps of Providing a substrate, Depositing the rare earth comprising layer onto the substrate, and Developing a mask structure to expose at least part of the rare earth comprising layer, and subjecting the exposed parts of rare earth comprising layer to a Cl comprising and/or Br comprising plasma to chlorinate (brominate) at least part of the exposed rare earth comprising layer, and removing the chlorinated (brominated) part of rare earth comprising layer using a wet etch.

According to preferred embodiments a method for forming a gate structure in an integrated circuit on a substrate and more specifically a high-k gate insulation structure is disclosed. A high-k layer is first deposited onto the substrate, and patterned with a mask to define the high-k gate insulation layer and exposed portions of the high-k layer. The exposed portions of the high-k layer are subjected to in-situ plasma species that causes chlorination (bromination) of the exposed portions of the high k layer. The in-situ plasma is a Cl and/or Br comprising plasma. The chlorinated (brominated) portions of the high-k layer can be selectively wet etched to leave the high-k gate insulation gate structure.

According to preferred embodiments the method is preferably used to pattern a high-k comprising stack of layers, most preferred the stack of layers are gate stack layers. The stack of layers is situated or deposited onto a substrate, most preferred the substrate is a silicon wafer. The aim of the patterning is to pattern or to form a gate structure in the gate stack layers. The gate structure comprises at least one gate electrode (layer) and at least one gate oxide (layer) situated below the gate electrode layer.

Optionally an interlayer can be deposited onto the substrate before depositing the gate stack layers, the interlayer can be a thermally grown $SiO_2$ layer. The thermally grown $SiO_2$ can be formed by subjecting the (silicon) substrate to a HF dip (2% HF for a few minutes).

Most preferred the gate stack layer used to form the gate electrode is a TiN, TiN/TaN or TaN layer. Other suitable gate electrode layers are also possible.

Most preferred the gate stack layer used to form the gate oxide (also referred to as gate insulator) is a high-k layer. More specifically, the high-k layer used is a rare earth comprising (based) high-k material such as a Dy and Sc comprising high-k materials.

According to preferred embodiments the problem of removal of rare earth based high-k materials, more specifically Dy and/or Sc comprising high-k materials such as $DyScO_3$ or $Dy_2O_3$ high-k dielectric materials selectively over a silicon comprising substrate without making an undercut under the gate structure is solved. Dry removal is impossible since neither Dy nor Sc form volatile compounds. Wet removal is possible, but due to isotropic nature of wet etch it etches the DyScO dielectric also laterally, creating an undercut at the gate edge beneath the gate.

According to preferred embodiments the problem of insufficient etch rate for rare earth based high-k materials such as Dy and Sc comprising high-k materials (e.g. $DyScO_3$) is solved by first performing a chlorination (bromination) step using a dry-etch plasma such that rare earth comprising chlorides (bromides) are formed (e.g. $DyCl_3$ and $ScCl_3$) which are water soluble. In a second step the rare earth comprising chlorides (bromides) are selectively removed from the substrate using a wet removal step. The wet removal step is preferably performed using a deionized water rinse.

According to preferred embodiments the method is solving the problem by chlorinating (bromating) the rare earth based high-k materials by means of a chlorine or bromine comprising plasma (e.g. $Cl_2$ or $BCl_3$). Further inert compounds can be added to the plasma such as nitrogen ($N_2$) and helium (He). In case the rare earth based high-k material is a Dy and/or Sc comprising high-k material such as DyScO$_3$ or Dy$_2$O$_3$ both Dy and Sc chlorides (e.g. DyCl$_3$ and ScCl$_3$) are water soluble such that they can be removed by water rinse. The method further provides the advantage of selective removal of rare earth based high-k materials over a silicon comprising substrate because Si is not etched by means of water. The method furthermore provides the advantage of avoiding or eliminating undercut in the patterned gate structure since the non-chlorinated (non-brominated) rare earth based high-k material e.g. non-chlorinated (brominated) DyScO$_3$ is not water soluble and hence only the chlorinated (brominated) part of the rare earth based high-k dielectric layer is removed by water. Since the plasma chlorination (bromination) is anisotropic, the dielectric beneath the gate is not chlorinated (brominated) and, therefore, not removed by water.

In a preferred embodiment the chlorination (bromination) step is at least partly performed during the step of patterning the gate electrode layer. In case the gate electrode layer is a metal comprising layer such as a TaN, TiN or a combination of a TaN/TiN layer, the patterning is performed using a chlorine (bromine) comprising plasma. The chlorine comprising plasma is preferably Cl$_2$ and/or BCl$_3$ since titanium and tantalum chlorides are volatile and reasonable selectivity to silicon comprising material on the wafer substrate (Si, SiO$_2$) can be obtained. During the patterning of the gate electrode layer, the rare earth based high-k material gets exposed to the chlorine comprising gas such that it becomes at least partly chlorinated.

The chlorinated part of the rare earth based can be removed after etch by performing a wet removal step. In case the rare earth based high-k material is a Dy and/or Sc based materials (e.g. DyScO$_3$ or Dy$_2$O$_3$) the wet removal is preferably a water based removal, most preferred the removal is a water rinse.

Figure 2:
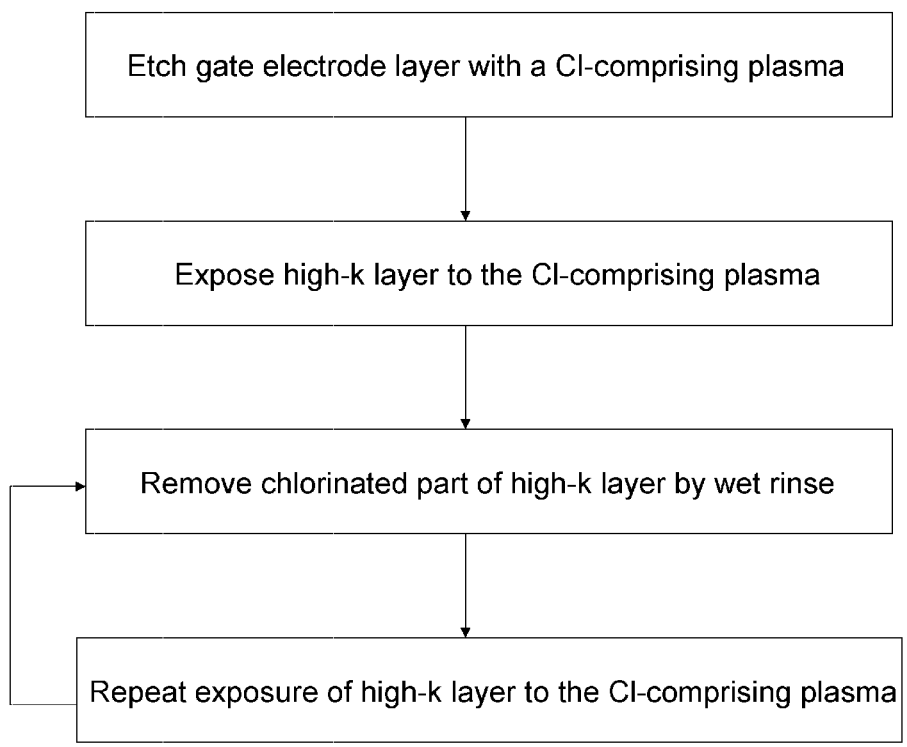
FIG. 2 illustrates a flowchart according to a preferred embodiment to perform selective removal of rare earth based high-k materials selectively over silicon comprising substrates.
Figure 3:
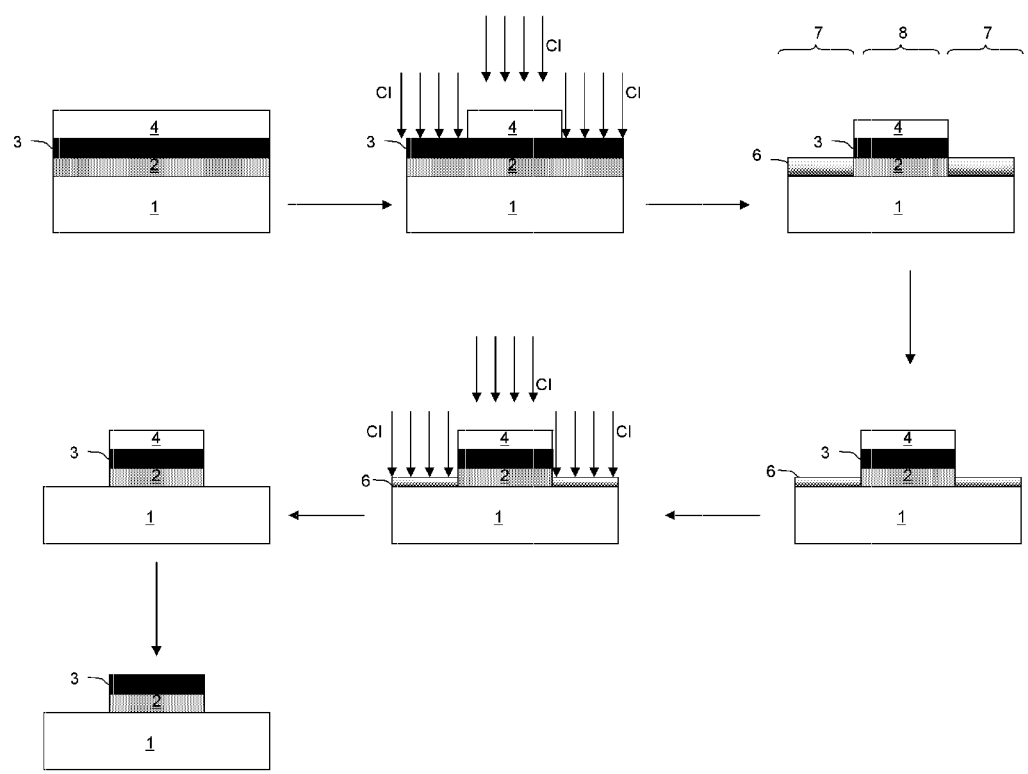
FIG. 3 illustrates the different processing steps according to a preferred embodiment to perform selective removal of rare earth based high-k materials selectively over silicon comprising substrates whereby the chlorination is performed partly during the patterning of the gate electrode layer and completed during an additional chlorination step.

FIG. 2 shows a flowchart illustrating the process flow according to a preferred embodiment wherein the rare earth based high-k material is at least partly chlorinated during the patterning of the gate electrode layer and FIG. 3 illustrates the different processing steps according to the preferred embodiment. The method start with providing a substrate 1, most preferred the substrate is Si wafer comprising active areas (e.g. source and drain). Optionally an interlayer can be deposited onto the substrate, the interlayer can be e.g. a thermally grown SiO$_2$ layer obtained after a thermal anneal or an HF dip (e.g. a dip in a 2% HF solution). Alternatively the interlayer can be a thin deposited layer such as e.g. a silicon nitride or silicon oxynitride layer with a thickness up to maximum 2 nm. Onto the substrate 1 a rare earth based high-k layer 2 is deposited, the rare earth based high-k layer 2 is preferably formed with a thickness of about 1 nm up to maximum 20 nm, and is preferably formed of an oxide of a rare earth metal, including at least one of the elements La, Pr, Nd, Sm, Gd, Tb, Dy, Ho, Er, Tm, Yb, and Lu and most preferred the rare earth based high-k material is a Dy and/or Sc comprising high-k material such as DyScO$_3$ and/or Dy$_2$O$_3$. The rare earth based high-k layer 2 is preferably initially formed as an amorphous layer, although depending upon the process used, it may also be initially formed as a crystalline layer, a further heat treatment can therefore be wanted upon becoming crystalline. It is further appreciated that the designation of the term "substrate" as used in the whole application refers to either the substrate without an additional interlayer or both to the substrate and all other layers—including the interlayer—which are formed on top of the substrate before the deposition of a high-k dielectric layer. Subsequently, a gate electrode layer 3 is deposited onto the rare earth based high-k layer 2. The gate electrode layer 3 is preferably a metal comprising layer such as a TaN, TiN or a combination of a TaN/TiN layer. A mask layer is then deposited onto the gate electrode layer 3, most preferred the mask layer is a photosensitive imaging layer(s) 4, optionally there can be a hardmask layer such as silicon nitride deposited before the deposition of the photosensitive imaging layer(s) 4. A gate pattern is then transferred into the photosensitive imaging layer(s) 4 by means of photolithographic patterning. An anisotropical dry-etching process is then applied to etch a gate structure 8 in the gate electrode layer 3, the plasma used to pattern the gate electrode layer 3 is a Cl comprising and/or Br comprising plasma such as Cl$_2$, (Br$_2$), HBr and BCl$_3$ comprising plasmas. The plasma can further comprise inert compounds and/or nitrogen. During the dry-etching of gate electrode layer 3 the rare earth based high-k layer 2 is not etched because the high-k layer 2 tends to be extremely resistive to etching, as described above. As far as the high-k layer 2 is not exposed to a Cl or Br comprising plasma the high k layer 2 tends to provide an excellent etch stop to the etching process used to define the gate electrode layer 3. The patterned gate electrode layer 3 therefore also defines a high-k gate insulation layer region 7, which defines exposed portions 7 of the high-k layer 2. The exposed portions 7 of the high k layer 2 are subjected to an in-situ plasma of Cl species that causes chlorination to the exposed portions 7 of the high k layer 6, as depicted in FIG. 3. However, the overlying gate structure 8 prohibits the in-situ plasma from chlorination of the high-k layer 2 in that region 8.

In a preferred embodiment and further illustrated in FIG. 3, the partly chlorinated high-k layer 6 is removed by means of a wet etch. The high-k layer is preferably a Dy and/or Sc comprising high-k material such as DyScO$_3$ and/or Dy$_2$O$_3$ and the wet etch is preferably a water rinse. To remove the high-k layer completely (selectively over the substrate) another chlorination step is needed, most preferred the chlorination step is an exposure of the high-k layer 6 to a Cl-comprising plasma. It is appreciated here that the energy of the plasma is not too high to avoid structural damage of the underlying substrate 1 and structures of the integrated circuit. It is intended to avoid damage to the underlying substrate or layer, preferably the substrate bias is around −30V (substrate bias should however be kept different from zero to avoid lateral exposure). The time of exposure of the high-k layer to the Cl-plasma should be sufficient to obtain complete chlorination. In a next step the remaining (chlorinated or brominated) high-k layer 6 will be removed by means of a wet etch as described above. In the case where the etchants did not remove the photosensitive imaging layer(s) 4 additional steps can be used for removing the layers as well as cleaning the surfaces of the subsequent structures.

Figure 4:
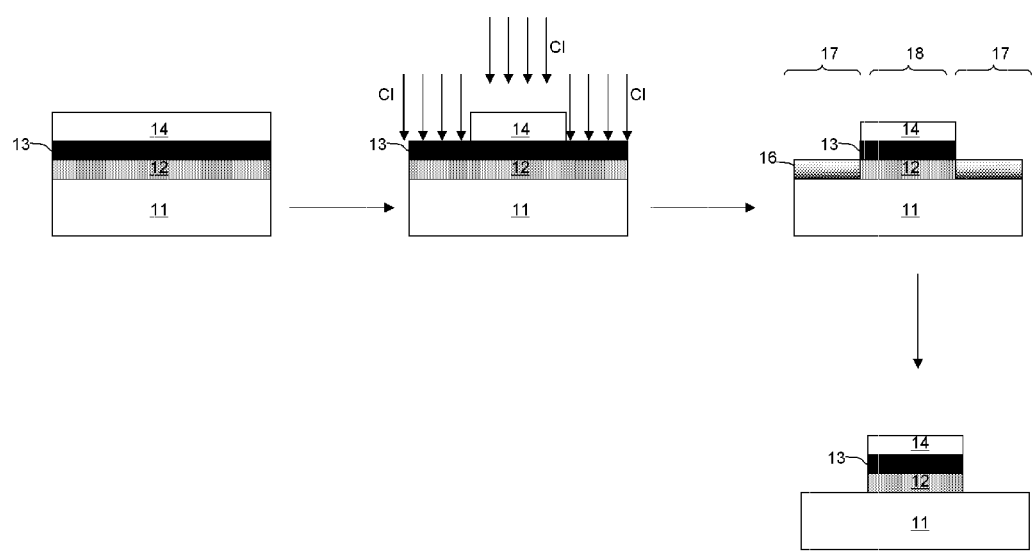
FIG. 4 illustrates the different processing steps according to a preferred embodiment to perform selective removal of rare earth based high-k materials selectively over silicon comprising substrates whereby the chlorination is performed completely during the patterning of the gate electrode layer.

In another preferred embodiment and illustrated in FIG. 4, the exposed portions 17 of the high k layer 12 are subjected to an in-situ plasma of Cl species that causes chlorination to the exposed portions 17 of the high k layer 16. The chlorination of the high-k layer 12 is performed during the etching (patterning) of the gate electrode layer 14 by means of an in-situ plasma comprising chlorine (Cl) species (ions, radicals and atoms). Time and exposure of the chlorination is such that complete chlorination of the exposed portions of the high-k layer is obtained. It is therefore preferred to extend the exposure to the Cl comprising plasma or in other words have further (extended) exposure to the Cl comprising plasma after the gate electrode patterning has been completed. Most preferred the substrate bias during the extended Cl exposure step is different from zero to avoid lateral exposure, a suitable substrate bias can be −30V. In the case where the etchants did not remove the photosensitive imaging layer(s) 14 additional steps can be used for removing the layers as well as cleaning the surfaces of the subsequent structures. The time of the chlorination should be such that the underlaying substrate or layer is not damaged or attacked.

Figure 5:
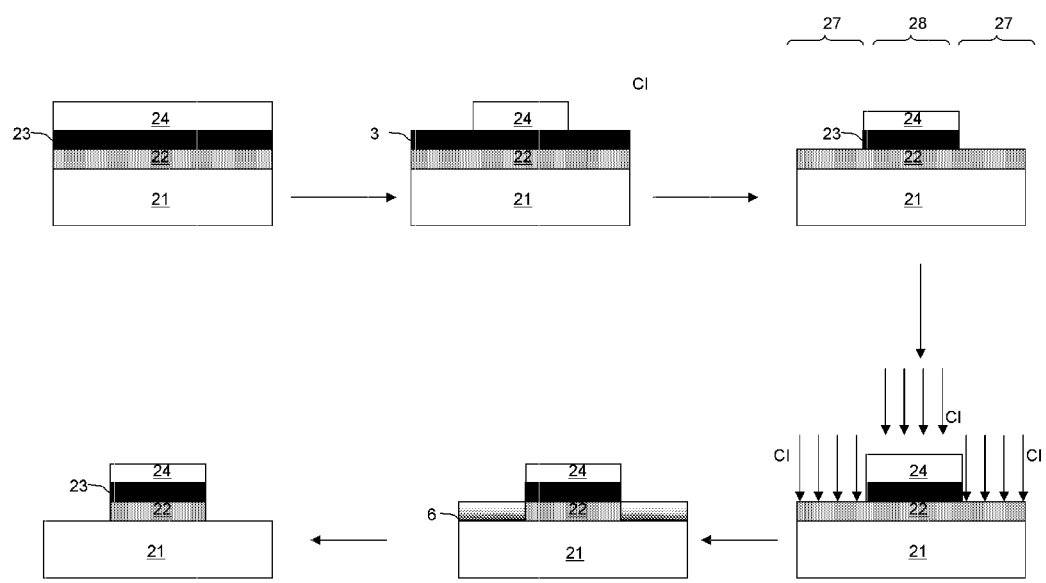
FIG. 5 illustrates the different processing steps according to a preferred embodiment to perform selective removal of rare earth based high-k materials selectively over silicon comprising substrates whereby the chlorination is performed after the patterning of the gate electrode layer.

In yet another and also preferred embodiment (as illustrated in FIG. 5), the plasma used to pattern the gate electrode layer 24 is not a chlorine comprising plasma and no chlorination occurs during the patterning of the gate electrode layer 24. The chlorination (or exposure to a Cl comprising plasma) and/or bromination (or exposure to a Br comprising plasma) of exposed portions 27 of the high-k layer 23 is therefore performed after the patterning of the gate electrode layer 24. The exposure can be done by means of an in-situ plasma having Cl species (ions, radicals and atoms).

To obtain a complete removal of the rare earth based high-k layer 23 such that a fully patterned gate oxide layer (rare earth based high-k layer) is obtained, the exposure time to the chlorine (bromine) comprising plasma should be sufficient. It is preferred to have immediately after the patterning of the gate electrode layer 24, a further exposure step during which the high-k layer 23 is further chlorinated (brominated). The further exposure step is preferably performed before removing the substrate out of the plasma etch chamber. In the case where the etchants did not remove the photosensitive imaging layer(s) 4 additional steps can be used for removing the layers as well as cleaning the surfaces of the subsequent structures.

In case a chlorine containing gas is used which further comprises nitrogen as inert compound, a water-soluble Boron-Nitrogen (BxNy) comprising film can be deposited during patterning depending on the plasma conditions. The Boron-Nitrogen film is preferably deposited onto the vertical sidewalls of a patterned structure (the gate structure) during patterning. The Boron-Nitrogen film is preferably advantageous when one of the gate stack layers is too sensitive to a chlorine comprising plasma such that vertical sidewalls of a patterned gate structure can be protected and sidewall damage during further patterning is avoided. The Boron-Nitrogen film can also be partly deposited onto the horizontal surfaces depending on the bias setting during patterning (or in other words voltage applied to the substrate during the patterning). The Boron-Nitrogen film can be removed simultaneously with the removal of the chlorinated (brominated) part of the rare earth based high-k layer by means of a wet removal step, most preferred the removal step is a water rinse.

Preferably, the chlorine comprising plasma used to perform the chlorination of the rare earth based high-k material (during patterning or after patterning of the gate electrode) has a substrate bias which is different from zero. Most preferred the substrate bias is around −30 Volt.

Preferably, the chlorine comprising plasma used to perform the chlorination of the rare earth based high-k material such as Dy and/or Sc comprising high-k material (e.g. $DyScO_3$ and/or $Dy_2O_3$) (during patterning or after patterning of the gate electrode) has a plasma power in the range of 100 W up to 1200 W. More preferred the plasma power is around 450 W.

Preferably, the pressure in the plasma chamber used to perform the chlorination of the rare earth based high-k layer (during patterning or after patterning of the gate electrode) is in the range of minimum 0.666 Pa (5 mT) and maximum 10.665 Pa (80 mT). More preferred the pressure is 1.333 Pa (10 mT).

Preferably, the chlorine comprising plasma used to perform the chlorination of the rare earth based high-k layer (during patterning or after patterning of the gate electrode) has a plasma temperature below 100° C. and most preferred the plasma temperature during dry-etch patterning is around 60° C.

The preferred time of exposure of the rare earth based high-k layer to the chlorine comprising plasma is dependent on the thickness of the high-k layer, the plasma settings such as substrate bias, etc. A higher substrate bias will give more ion bombardment and can therefore reduce thickness of the rare earth based high-k layer (e.g. $DyScO_3$) during exposure to the Chlorine plasma.

If needed the sequence of first a step of chlorination in a chlorine comprising plasma followed by the step of removing the chlorinated (brominated) part of the rare earth based high-k layer can be repeated until complete removal (selective) of the comprising high-k layer and/or complete patterning of the gate structure is obtained.

If needed the step of chlorination (bromination) of the rare earth based high-k layer during the patterning of the gate electrode (simultaneously chlorinated (brominated)) can be combined with the step in which chlorination step is performed after patterning.

It is further an aim to disclose the use of a (bromination) plasma for the chlorination of the rare earth based high-k layer such that a selective removal of the rare earth based high-k layer towards silicon and silicon dioxide is possible. The removal can be performed using a wet removal step, most preferred the wet removal step is a water rinse.

Since Dy and Sc (and their oxides) are difficult to etch, the etching could be easily stopped on them. For patterning of the metal gates (TiN and TaN) on top of Dy and/or Sc comprising high-k material (e.g. $DyScO_3$ and/or $Dy_2O_3$), chlorine-containing gases ($Cl_2$ and $BCl_3$) can be used since titanium ant tantalum chlorides are volatile and reasonable selectivity to other material present on the wafer (Si, $SiO_2$) can be obtained.

EXAMPLES

Example 1

Deposition of $DyScO_3$ Layer $DyScO_3$ layers are deposited by Atomic Vapor Deposition (AVD®). AVD® introduces the precursors in a pulsed mode through separate, independent injectors. All layers were deposited on a thin $SiO_2$ layer made in a DI $H_2O/O_3$ solution. This treatment results in a $SiO_2$ layer, approximately 0.8 nm thick, and is often referred to as an "IMEC-clean" starting surface. The precursors used to deposit DyScO layers by AVD® in the experiment are Dy(mmp)$_3$ ([Tris(1-methoxy-2-methyl-2-propoxy)Dysprosium; Dy($OC(CH_3)_2CH_2OCH_3$)$_3$]) and Sc(mmp)$_3$ ([Tris(1-methoxy-2-methyl-2-propoxy)Scandium; Sc ($OC(CH_3)_2CH_2OCH_3$)$_3$]). In FIG. 2 a growth curve is shown for DyScO with a Dy/Sc ratio of 80/20. A linear relation is found between the thickness and the total number of injected pulses. Variation of the ratio of injected Dy to Sc-pulses allows changing the composition of the deposited layer and it has been shown that these precursors allow the deposition of layers that span the range from pure $Dy_2O_3$ to pure $Sc_2O_3$. The efficiency of the Sc-precursor was found to be a factor of 6 higher as compared to the Dy-precursor. As a result, a 50/50 composition is obtained for a precursor pulse ratio [Dy/(Dy+Sc)] equal to 0.86. The layers were found to be very smooth by Atomic force Microscopy measurements with rms/thickness values between 3 and 5% for ~5 nm thick layers. The precursors are dissolved in toluene (using tetraglyme as stabilizer) in a concentration of 0.1M.

The thickness of the layers was measured by Spectroscopic Ellipsometry (SE) using a KLA/TENCOR ASET F5. A single-layer model was used to determine the refractive index and thickness of the deposited layer (i.e. high-k layer and interfacial layer (IL) in between the high-k layer and the Si-substrate are measured as one layer). For a selected sample set, the SE thickness was verified by Transmission Electron Microscopy (TEM), demonstrating a good correlation between the different techniques.

The composition of the different layers was determined by X-ray Photoelectron Spectroscopy (XPS) or Rutherford Backscattering Spectroscopy (RBS). The amount of contamination in the layers was assessed by Time of Flight Secondary Ion Mass Spectroscopy (ToF-SIMS). The surface roughness was measured by Atomic Force Microscopy (AFM).

Example 2

Use of a $BCl_3$ or $Cl_2$ Plasma to Chlorinate a $DyScO_3$ Layer and Removal of the Chlorinated $DyScO_3$ by Water Wafers having $DyScO_3$ layers which are deposited by Atomic Vapor Deposition (AVD®) were etched in LAM Versys2300 TCP etch reactor that allows separate control of plasma power and substrate bias. The etch was done using either of two gases, $Cl_2$ or $BCl_3$ at 450 W plasma power, −30V substrate bias, 10 mT pressure for 30 s. The thickness of the layer before and after etch was measured by spectroscopic ellipsometry. Then the etched layers were subjected to 10 min DI water rinse and the thickness was measured again.

Etch rate tests performed on blanket $DyScO_3$ (layer of 30 nm) wafers confirm the predictions. In the case of $Cl_2$, 1.5 nm of $DyScO_3$ was removed probably by physical sputtering. Water rinse removed additional 1.2 nm (probably the chlorinated surface layer). $BCl_3$ was found to deposit a layer of 4.3 nm $B_xN_y$ on top of $DyScO_3$ (the layer contains B and Cl and is water soluble). The water rinse removed the deposited layer plus 1.5 nm of $DyScO_3$ (probably the chlorinated surface layer).

We can conclude that at the mentioned conditions the etch rate is about 3 nm/min in pure $Cl_2$ and zero in pure $BCl_3$. Both gases chlorinate the top 1-1.5 nm layer of $DyScO_3$ in 30 s that can be removed by water rinse.

It can be concluded that chlorination of the $DyScO_3$ materials by means of a $Cl_2$ plasma and/or $BCl_3$ plasma makes it possible to transform the $DyScO_3$ materials into a chlorinated $DyScO_3$ material which is water soluble such that it can be selectively removed towards silicon, silicon dioxide and other materials used as gate stack materials in a semiconductor device.

FIG. 1 illustrates $DyScO_3$ thickness after the removal experiments using the method of the preferred embodiments. The initial thickness is 10 nm, after exposure to $Cl_2$ plasma for 30 s about 1.5 nm is removed, probably due to physical sputtering. The $BCl_3$ plasma deposits as film on top (probably $B_xCl_y$ film), but does not result in the thickness decrease. Water rinse removes around 1.5 nm in the case of DyScO exposure to $Cl_2$ (probably, the chlorinated layer) and around 5.5 nm in the case of $BCl_3$ exposure ($B_xCl_y$ film plus chlorinated Dy and/or Sc comprising high-k layer (e.g. $DyScO_3$ and/or $Dy_2O_3$)). The thickness of the Dy and/or Sc comprising high-k layer (e.g. $DyScO_3$ and/or $Dy_2O_3$) in real devices usually in the range of 2-4 nm.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for selectively removing, at least partly, a layer comprising a rare earth over a substrate, the method comprising the steps of:
    depositing a layer comprising a rare earth onto a substrate;
    depositing a photosensitive imaging layer and developing a mask structure to expose at least part of the layer comprising a rare earth;
    subjecting the exposed part of the layer comprising a rare earth to a plasma comprising at least one halogen selected from the group consisting of chlorine and bromine, whereby at least part of the exposed part of the layer comprising a rare earth is halogenated, such that at least one water soluble rare earth halide is formed; and
    solubilizing the rare earth halide using a water based wet etch, thereby removing the halogenated part of the exposed part of the layer comprising a rare earth.

2. The method of claim 1, wherein the step of subjecting the exposed part of the layer comprising a rare earth to a plasma is performed by an anisotropic dry-etch plasma.

3. The method of claim 1, wherein the step of solubilizing the rare earth halide using a water based wet etch forms a gate structure in the layer comprising a rare earth.

4. The method of claim 3, wherein the layer comprising a rare earth is a high-k gate dielectric layer, and wherein the structure is a gate structure in a semiconductor device.

5. The method of claim 1, wherein the layer comprising a rare earth is a high-k dielectric layer, and wherein the method further comprises, after the step of depositing the high-k dielectric layer onto a substrate, the steps of:
    depositing a gate electrode layer onto the high-k layer;
    depositing at least one photosensitive imaging layer and transferring a photolithographic pattern in the imaging layer to define a gate structure; and
    transferring the gate structure pattern into the gate electrode layer.

6. The method of claim 5, wherein the gate electrode layer comprises a material selected from the group consisting of TaN, TiN, and TaN/TiN.

7. The method of claim 5, wherein the step of subjecting the exposed part of the layer comprising a rare earth to a plasma is performed by an anisotropic dry-etch plasma during the step of transferring the gate structure into the gate electrode layer using a plasma comprising at least one halogen selected from the group consisting of chlorine and bromine, such that the exposed portion of the rare earth comprising layer is halogenated.

8. The method of claim 1, wherein the layer comprising a rare earth is a high-k layer comprising at least one scandate material selected from the group consisting of $DyScO_3$, $LaScO_3$, $PrScO_3$, $NdScO_3$, $GdScO_3$, $TbScO_3$, $HoScO_3$, $ErScO_3$, $TmScO_3$, $YbScO_3$, and $LuScO_3$.

9. The method of claim 1, wherein the layer comprising a rare earth is a high-k layer, and wherein the layer comprising a rare earth comprises at least one rare earth oxide selected from the group consisting of $DyO_3$, $LaO_3$, $PrO_3$, $NdO_3$, $GdO_3$, $TbO_3$, $HoO_3$, $ErO_3$, $TmO_3$, $YbO_3$, and $LuO_3$.

10. The method of claim 1, wherein the layer comprising a rare earth is a high-k layer comprising $DyScO_3$.

11. The method of claim 1, wherein the plasma comprises at least one of $Cl_2$ and $BCl_3$.

12. The method of claim 1, wherein the plasma comprises at least one of $Br_2$ and HBr.

13. The method of claim 1, further comprising, after the step of solubilizing the rare earth halide using a water based wet etch, a step of removing remaining parts of the photosensitive imaging layer.

14. The method of claim 1, wherein the substrate is a silicon wafer.

15. The method of claim 1, wherein the water based wet etch is a water based rinse.

16. The method of claim 1, wherein a substrate bias during the step of subjecting the exposed part of the layer comprising a rare earth to a plasma is about −30V.

17. The method of claim 1, wherein a plasma power during the step of subjecting the exposed part of the layer comprising a rare earth to a plasma is from about 100 W to about 1200 W.

18. The method of claim 1, wherein a plasma power during the step of subjecting the exposed part of the layer comprising a rare earth to a plasma is about 450 W.

19. The method of claim 1, wherein a plasma pressure during the step of subjecting the exposed part of the layer comprising a rare earth to a plasma is from about 10 mT to about 80 mT.

20. Use of the method of claim 1 for the patterning a gate structure in a semiconductor device.

21. The method of claim 1, wherein the wet etch consists essentially of water.

* * * * *

UNITED STATES PATENT AND TRADEMARK OFFICE
CERTIFICATE OF CORRECTION

| | |
|---|---|
| PATENT NO. | : 7,521,369 B2 |
| APPLICATION NO. | : 11/876614 |
| DATED | : April 21, 2009 |
| INVENTOR(S) | : Shamiryan et al. |

Page 1 of 1

It is certified that error appears in the above-identified patent and that said Letters Patent is hereby corrected as shown below:

Issued Patent

| Column | Line | 1. Description of Error |
|---|---|---|
| Page 1 (Item 57) Abstract | 12 | Change "ant" to --and--. |

Signed and Sealed this

Twenty-second Day of September, 2009

David J. Kappos
*Director of the United States Patent and Trademark Office*